United States Patent
Seevinck et al.

(10) Patent No.: US 7,038,936 B2
(45) Date of Patent: May 2, 2006

(54) READING CIRCUIT FOR READING A MEMORY CELL

(76) Inventors: Evert Seevinck, Sterreschansweg 79, 6522 GM Nijmegen (NL); Alain Michel Marie Thijs, Prof. Holstlaan 6, 5656 AA Eindhoven (NL); Patrick Van De Steeg, Prof. Holstlaan 6, 5656 AA Eindhoven (NL); Maurits Mario Nicolaas Storms, Prof. Holstlaan 6, 5656 AA Eindhoven (NL)

( * ) Notice: Subject to any disclaimer, the term of this patent is extended or adjusted under 35 U.S.C. 154(b) by 72 days.

(21) Appl. No.: 10/503,459
(22) PCT Filed: Jan. 20, 2003
(86) PCT No.: PCT/IB03/00119
    § 371 (c)(1),
    (2), (4) Date: Aug. 3, 2004
(87) PCT Pub. No.: WO03/067598
    PCT Pub. Date: Aug. 14, 2003

(65) Prior Publication Data
    US 2005/0270833 A1    Dec. 8, 2005

(30) Foreign Application Priority Data
    Feb. 6, 2002 (EP) .................................. 02075495

(51) Int. Cl.
    *G11C 11/00* (2006.01)
(52) U.S. Cl. ............ 365/154; 365/189.05; 365/189.01; 365/185.21
(58) Field of Classification Search ................ 365/154, 365/189.05, 189.01, 189.21
    See application file for complete search history.

(56) References Cited

U.S. PATENT DOCUMENTS 5,563,826 A * 10/1996 Pascucci et al. ....... 365/185.21
6,205,070 B1    3/2001 Seevinck et al.
6,359,808 B1 *  3/2002 Chen et al. ............ 365/185.21

FOREIGN PATENT DOCUMENTS

EP    0747903 A1    12/1996
EP    0747903 B1    12/1996

* cited by examiner

*Primary Examiner*—Richard Elms
*Assistant Examiner*—N Nguyen

(57) ABSTRACT

A reading circuit comprises a first and second cascode circuit and a first and second current mirror. The first cascode circuit can be connected to a bit line of a memory cell and the second cascode circuit can be connected to a reference bit line of a reference cell. The first output terminals of the first and second cascode circuits are connected to first terminals of the first and second current mirrors, respectively. The second output terminals of the first and second cascode circuits are connected to the second terminals of the second and first current mirrors, respectively. A tri-state buffer is coupled between the second terminals of the first and second current mirrors said buffer having bit invert capabilities.

6 Claims, 3 Drawing Sheets

READING CIRCUIT FOR READING A MEMORY CELL

Figure 1:
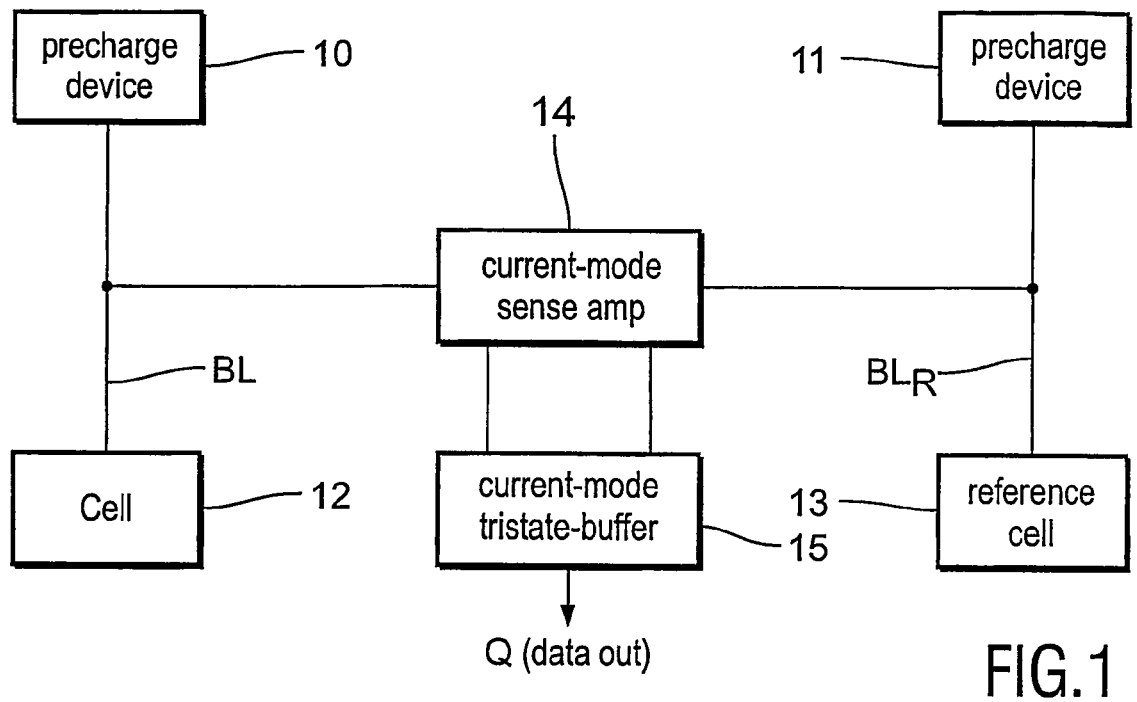

The invention relates to a reading circuit for reading a memory cell having a single bit line and a corresponding reference cell, and an integrated circuit including a memory having memory cells and reference cells.

The reference cells reading technique uses a non-volatile memory cell identical to a memory cell which is selected by decoding blocks. While the selected cell may be written or not (or have a high or low threshold), the reference cell will always be cancelled (low threshold). Therefore, a reading circuit will compare a low threshold cell (which will therefore draw a rated current typical of its physical characteristics) with a cell which might have a low or high threshold depending on how it has been previously programmed. Obviously the selected cell will draw substantially the same current as the reference cell if the threshold is low, and zero current if the threshold is high. In the output stages, a reading circuit should provide a high or low logic value depending upon whether the selected cell is the same as or different from the reference cell, as seen from the point of view of the threshold.

A typical generic reading system using a reference cell is embodied as a sensing circuit used for reading a value of a selected memory cell. Two decoders connect memory cells attached to a set of word lines to the sensing circuit. Bit lines, which interconnect to the word lines at the memory cells and a first decoder form a memory matrix with the word lines and allow selected memory cells to be electrically connected directly to the sensing circuit for reading. A second decoder allows a reference bit line to electrically connect directly to a reference memory cell to the sensing circuit as well. During reading, the decoders are set to allow a reference memory cell and a selected memory cell to be selected from a common word line. The basic concept of the technique is to compare the generic cell selected (which may have a high or low threshold) with the reference cell which is always virgin, and will therefore always absorb the rated current characteristic for it.

Reading using the reference cell technique is not in fact performed by comparing any cell with a single reference cell, rather it compares the bit line which contains the cell which is to be read with the reference bit line.

The advantage of reading using the technique which makes use of a reference cell, in comparison with reading a differential cell (where the value of data is stored in two memory cells in its direct and complemented form), is essentially that it occupies a smaller area of silicon.

The junction capacitances associated with the drains of these cells add together resulting in an overall capacitive load of several pico farads. Obviously, the high capacitance of the bit line limits the sensing speed of any system of reading which is based on the amplification of a voltage signal evolved in the drain from the selected cell (voltage-mode operation).

The alternative of current sensing is therefore preferable. The circuitry designed to identify the value of data, i.e. the sense amplifier, should have a low input impedance and respond to current rather that voltage signals. The advantage of this method is based essentially on the low input impedance which makes it possible to pass the current from the cell into the sense amplifier without the voltage in the bit line undergoing any appreciable variation. Usually a "precharging" operation is also performed in this situation, before reading takes place, in order to achieve the optimum voltage on the bit line for performing reading from the node.

A single bit line memory, e.g. a ROM (Read only memory), is generally sensed by allowing a pre-charged bit line to be discharged by a cell current. When the bit line voltage exceeds a certain threshold the state of the cell, i.e. the data, is detected, and output along a specifically timed path. A bit line voltage swing is large which causes cross talk between the adjacent bit lines, such that large sensing thresholds are needed. However, this leads to a still further relative long delay. The data path to the output terminal must be carefully timed by incorporating delays as safety margins for reliability reasons.

EP 0 747 903 discloses a reading circuit for reading a memory cell on the basis of the reference cell technique as well as for reading a memory cell of the differential type. The reading circuit comprises a structure of the differential type having two branches connected to one supply line VDD and each comprising, in a cascade arrangement an electronic switch and an active element connected in a feedback loop to the active element of the other branch, whereby a voltage amplifier is formed. The reading circuit further comprises an equalising micro-switch inserted between the two branches and connected to two sensing nodes in a feedback loop. These two sensing nodes are connected to a transistor DL, DR respectively, which are provided for the purpose of precharging the sensing nodes. The operation of the reading circuit is essentially based on a high-gain positive feedback loop which latches when it is activated.

From U.S. Pat. No. 6,205,070 a current sense amplifier is known which was mainly designed for reading a memory cell of the differential type but which can also be used for reading a memory cell on the basis of the reference cell technique. The sense amplifier comprises two branches each having a pair of output transistors. The sources of each output transistor pair in each branch are connected to one another and are further coupled to a bit line and a reference bit line, respectively. The gates of said output transistor pair in each branch are connected to one another, respectively.

The drains of the pair of output transistors from the first and second branch of the sense amplifier are coupled to a first branch of an output buffer and the drains of the pair of output transistors from the second branch of the sense amplifier are coupled to a second branch of said output buffer. In particular, the drains of the first transistors of the pairs of output transistors of each branch are connected to a first and second output node, respectively. The drains of the second transistors of the pairs of output transistors of each branch are connected cross wise to the second and first output node via a first and second current mirror, respectively.

In operation the output transistor pairs from each branch receive as gate-source voltages signals that are determined by the current differences between the first and second bit lines. The current flowing from the drains of the output transistors differ in proportion to the differences between the currents of the first and second bit lines. The currents from the output transistor flow directly to the output nodes. The currents from the second ones of the output transistors are reflected cross wise to the output nodes. Therefore, the current which flows from each node is proportional to the current that flows into the other node.

The first and second output node is coupled to the gates of first and second pull-down transistors, wherein the drains of the pull-down transistors are coupled to the inputs of cross-coupled inverters.

It is on object of the invention to further improve the reading of a memory cell having a single bit line.

This object is solved by a reading circuit for reading a memory cell having a single bit line and a corresponding reference cell according to claim 1 and an integrated circuit including a memory having memory cells and reference cells according to claim 6.

The invention is based on the idea to use a reading circuit having a first and second cascode circuit and a first and second current mirror. The first cascode circuit can be connected to a bit line of a memory cell while the second cascode circuit can be connected to a reference bit line of a reference cell. First output terminals of the first and second cascode circuits are connected to first terminals of the first and second current mirrors, respectively. Second output terminals of the first and second cascode circuits are connected to the second terminals of the second and first current mirrors, respectively. A tri-state buffer is coupled between the second terminals of the first and second current mirrors and has a bit inverting capability.

The use of a tri-state buffer instead e.g. pull-down MOS transistors is advantageous since a tri-state buffer is capable of reacting faster to changes of the levels at the output nodes of the reading circuit. The access time for reading a memory cell is further reduced as the cascode circuits directly receive the current from the bit line and the reference bit line. The usage of a tri-state output buffer further reduces the access time since the output buffer is self-timed, thus eliminating various timing margins. The built-in voltage threshold of a tri-state output buffer additionally allows a reliable detection of a one or a zero and furthermore reduces the sensitivity of the reading circuit to power supply interference, bit line mismatch and crosstalk. The reading circuit is especially suited for single-bitline memories.

Furthermore, the data read from the memory cell is only latched in the output buffer as part of the output stage, such that fast and reliable reading operation even for low voltages can be achieved.

In a further aspect of the invention the two cascode circuits are adapted as folded cascodes each having two transistors coupled to one another at their respective sources, wherein the common sources of the first and second cascode circuits can receive the currents from the bit line and the reference bit line. Therefore, the bit lines can be connected to low impedances which can drastically reduce the bit line voltage swing. Furthermore the cascode circuits directly receive the currents from the bit lines and forward them to the subsequent current mirrors.

In still a further aspect of the invention a ratio of the outputs from said first and second output terminals of said cascode circuits is adapted as 1:m, wherein m being larger than or equal to 1, and said first and second current mirror circuits are configured having a n:1 current transfer ratio, wherein n being larger than or equal to 1. In particular the current transfer factor n of the current mirrors is chosen larger than the output factor of the cascode circuits. Adjusting n as being larger than m will improve the immunity of the reading circuit with regard to bit line mismatches and supply noise, since the effects of differences between the currents from the bit line and the reference bit line—entering the cascode circuits—will be reduced.

In a preferred aspect of the invention the tri-state buffer is configured as a SRAM cell. The usage of a SRAM cell as output buffer will decrease the access times, since it can provide a sharper switching edge as compared to a MOS transistor possibly with some kind of capacitive load coupled to it.

Figure 2:
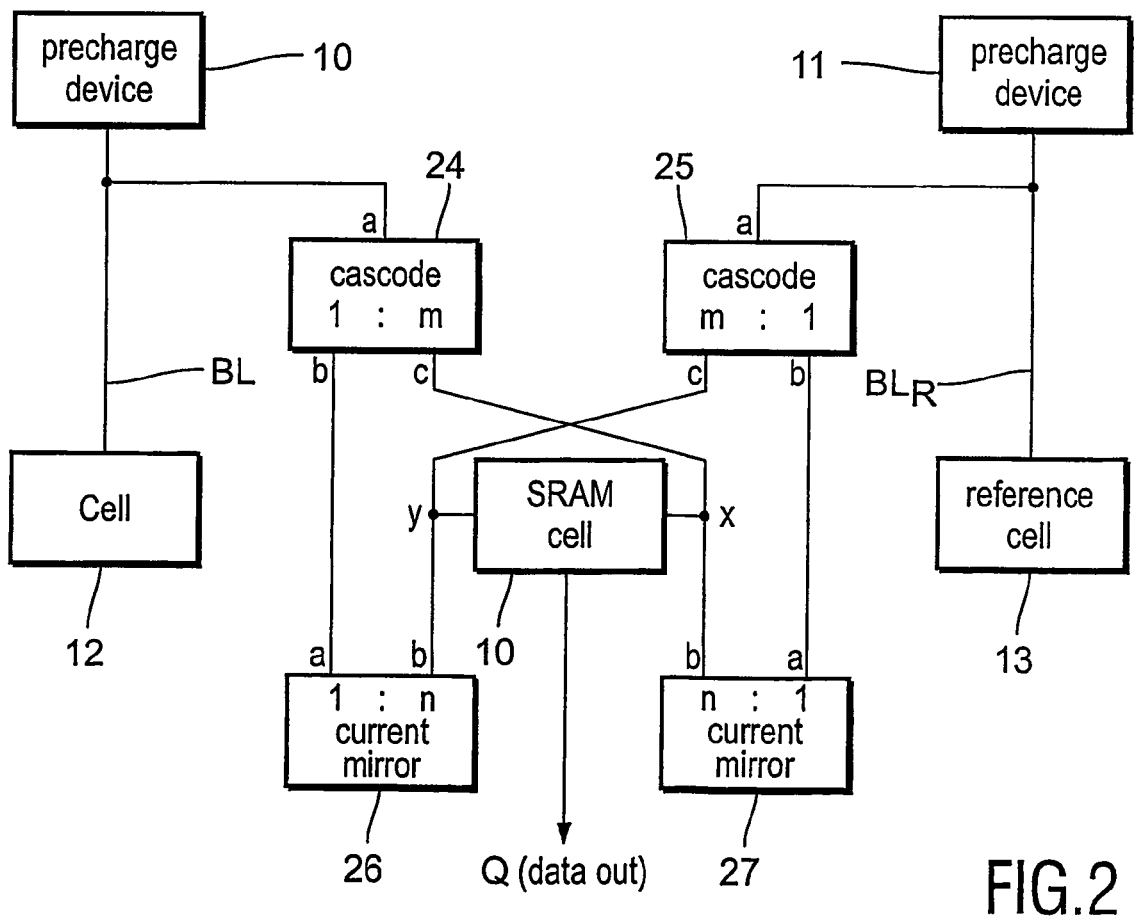
Figure 3:
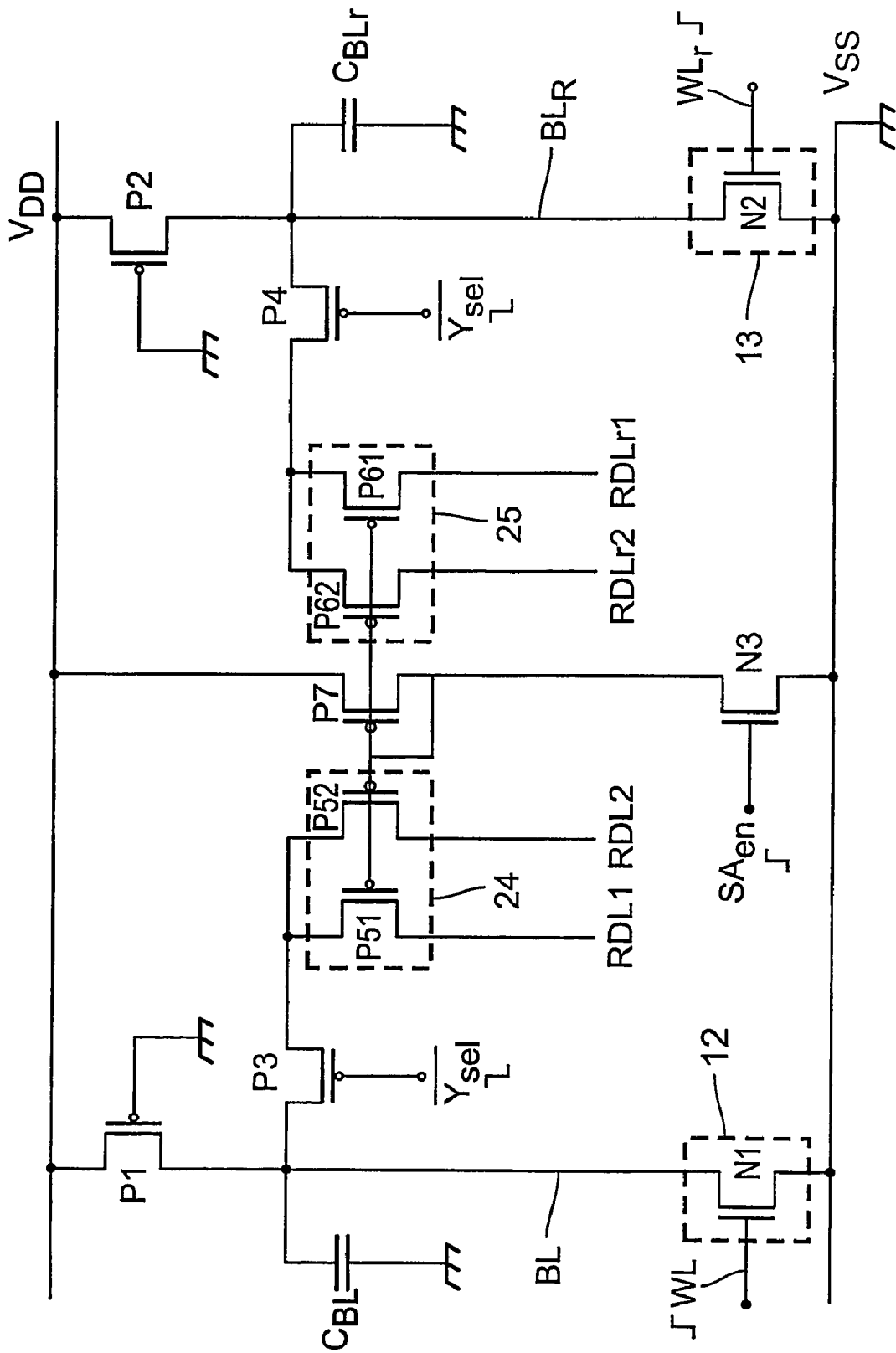
Figure 4:
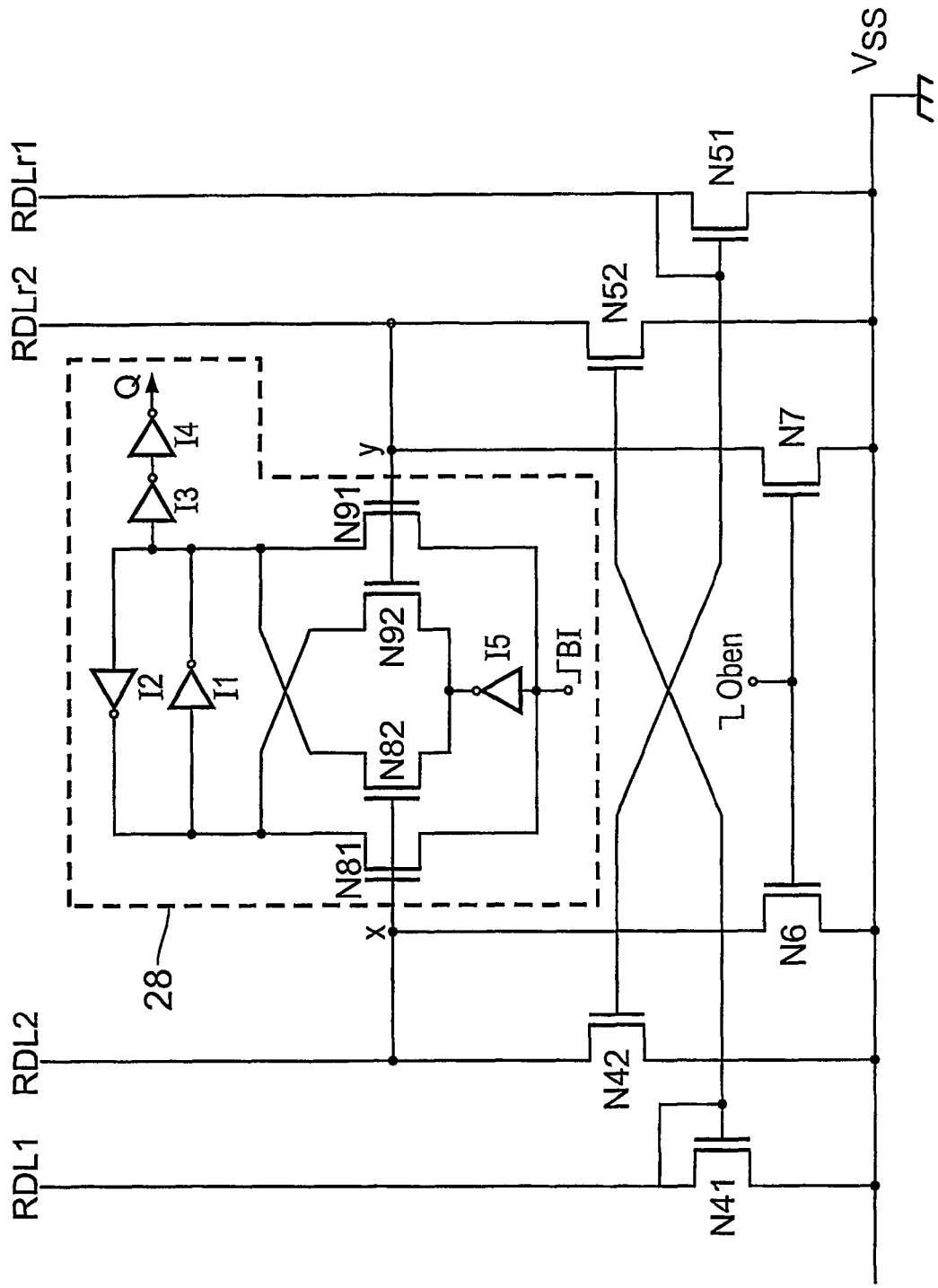

The invention is now described in more detail with reference to the figures, wherein:

FIG. 1 shows a schematic block diagram of an arrangement of a memory cell, a reference cell and an associated reading circuit, FIG. 2 shows a more detailed block diagram based on standard circuit functions of the arrangement according to FIG. 1, FIG. 3 shows a circuit diagram of a current-mode sense amplifier according to FIG. 1, and FIG. 4 shows a circuit diagram of a current-mode tri-state buffer according to FIG. 1.

In FIG. 1 an arrangement of a memory cell 12 having a single bit line BL and a corresponding reference cell 13 with a reference bit line $BL_R$ as well as an associated reading circuitry for reading said memory cell 12 and said reference cell 13 is shown. FIG. 1 also shows a first precharge device 10 for precharging the bit line BL and a second precharge device 11 for precharging the reference bit line $BL_R$. The reading circuitry is formed by a current-mode sense amplifier 14 and a current mode tri-state buffer 15. The sense amplifier 14 receives the currents from the bit line BL and the reference bit line $BL_R$ as input signals, performs the sensing operation on these currents, and outputs the sensing results to the current-mode tri-state buffer 15. The current-mode tri-state buffer 15 compares the sensed current from the bit line BL and the reference current sensed from the reference bit line $BL_R$. The tri-state buffer 15 comprises a current-to-voltage converter circuit having a built-in comparison threshold allowing a reliable detection of a one or a zero and finally outputs the end result Q (data out).

FIG. 2 shows the arrangement of FIG. 1 in more detail on the basis of standard circuit functions. Again the first precharge device 10 is connected to the memory cell 12 via the bit line BL while the second precharge device 11 is connected to the reference cell 13 via the reference bit line $BL_R$. FIG. 2 further shows a first and second cascode circuit 24, 25, a first and second current mirror 26, 27 and a SRAM cell 28.

The first cascode circuit 24 receives the current from the bit line BL as input through its input terminal 24a and the second cascode circuit 25 receives the current from the reference bit line $BL_R$ as input through its input terminal 25a. A first output terminal 24b of the first cascode circuit 24 is coupled to a first terminal 26a of the first current mirror 26 and a second output terminal 24c of the first cascode circuit 24 is coupled to a second terminal 27b of the second current mirror 27, forming a first output node X. Furthermore a first output terminal 25b of the second cascode circuit 25 is coupled to a first terminal 27a of the second current mirror 27 and a second output terminal 25c of the second cascode circuit 25 is coupled to a second terminal 26b of the first current mirror 26, forming a second output node Y. The SRAM cell 28 is coupled between the first and second output nodes X, Y. The cell 28 acts as a multivibrator and outputs Q (data out) as output signal dependent on the voltage levels at the output nodes X, Y.

FIG. 3 shows a CMOS circuit realisation of the current-mode sense amplifier 14 in the arrangement according to FIG. 1. In a first branch the memory cell 12 is embodied as NMOS transistor N1 receiving the word line activating signal WL as gate input, having its drain coupled to $V_{ss}$, and its source coupled to the bit line BL. The bit line BL is further connected to the supply voltage $V_{DD}$ via a PMOS transistor P1 which serves as first precharge device 10 and moreover to a capacitance $C_{BL}$ representing bit line BL capacitance. In the second branch the reference cell 13 is embodied as NMOS transistor N2 receiving the reference word line activating signal WLr as gate input, having its drain coupled to $V_{ss}$, and its source coupled to the reference bit line BL. The reference bit line $BL_R$ is further connected to the supply voltage $V_{DD}$ via a PMOS transistor P2 which serves as second precharge device 11 and moreover to a capacitance $C_{BLr}$ representing the reference bit line $BL_R$ capacitance.

The bit line BL and the reference bit line $BL_R$ are coupled to the first and second cascode circuits 24, 25 via PMOS transistors P3, P4, respectively, wherein the gates of the PMOS transistors P3, P4 are connected to select input signal $Y_{sel}$, respectively. The first cascode circuit 24 comprises a first and second output PMOS transistor P51, P52 in form of a folded cascode arrangement. The sources thereof are connected to one another and are coupled to the bit line BL via the PMOS transistor P3. The second cascode circuit 25 comprises a third and fourth output PMOS transistor P61, P62 also in form of a folded cascode arrangement. The sources thereof are connected to one another and are coupled to the reference bit line $BL_R$ via the PMOS transistor P4. The gates of the first, second, third and fourth output transistors are coupled to one another and are furthermore connected to the gate of a PMOS transistor P7, wherein the gate and the drain of the PMOS transistor P7 are coupled to one another. The source of the PMOS transistor P7 is connected to the supply voltage $V_{DD}$, while the drain thereof is coupled to the voltage $V_{ss}$ via a NMOS transistor N3, which receives a signal $SA_{en}$ as gate signal. The signal $SA_{en}$ enables the sense amplifier by turning on the PMOS transistor P7.

The drains of the first, second, third and fourth output PMOS transistors P51, P52, P61, and P62 form the output terminals RDL1, RDL2, $RDL_T1$ and $RDL_T2$, corresponding to the output terminals 24b, 24c, 25b and 25c of the first and second cascode circuits 24, 25 according to FIG. 2, respectively.

FIG. 4 shows a CMOS circuit realisation of the current mode tri-state buffer 15 of FIG. 1 comprising a current-to-voltage converter and an output buffer.

The drains of the second and fourth output transistors P52, P62 are connected to the first and second output nodes X, Y, respectively. The drains of the first and third output transistors P51, P61 are coupled cross-wise to the second and first output node Y, X via the first and second current mirrors 26, 27, respectively. The first current mirror 26 is formed by NMOS transistors N41, N52 and the second current mirror 27 is formed by NMOS transistors N51, N42. The output nodes X, Y are coupled to $V_{ss}$ via the NMOS transistors N6, N7, respectively, wherein the gates of the NMOS transistors N6, N7 are connected to one another and are coupled to a signal $OB_{en}$. Using the signal $OB_{en}$ the output buffer is enabled by turning off N6, N7. This allows the voltages at the nodes X, Y to build up from zero.

The cell current, i.e. the current from the bit line BL, is input to the commonly coupled sources of first and second PMOS transistors P51, P52 of the first cascode circuit 24. The reference cell current, i.e. the current from the reference bit line $BL_R$, is input to the commonly coupled sources of third and fourth PMOS transistor P61, P62 of the second cascode circuit 25. This is advantageous since the bit line BL and the reference bit line $BL_R$ are thus connected to low impedance input terminals which is drastically reducing the bit line voltage swing. Furthermore the cell currents are directly received by the first and second cascode circuits 24, 25 and passed onto subsequent circuits. The cascode circuits 24, 25 are configured having dual ratioed outputs with a ratio of 1:m, i.e. the output signals from the second output terminals 24c, 25c of the first and second cascode circuits 24, 25 are m-times higher than the output signals from the first output terminals 24b, 25b of the first and second cascode circuits 24, 25, wherein m is greater than zero. The ratioed currents from the first and second output terminals 24b, 24c, 25b, 25c of the cascode circuits 24, 25 are input into the first and second current mirrors 26, 27 having a current transfer ratio of n:1, wherein n is greater than zero.

When word lines WL which activate the memory cell 12 and the reference cell 13 are low, no current will flow from the memory cells and the reference cells over the bit line BL and the reference bit line $BL_R$. Accordingly, the first and second cascode circuits 24, 25 will both receive a corresponding current from the first and second precharge devices 10, 11 since the precharge device 10, 11 are of the same dimensions. For the case that n is chosen larger than m, the output nodes X, Y are both pulled low towards $V_{ss}$ and the SRAM cell 28 is not influenced. Adjusting n as being larger than m has the positive effect that differences between the current from the bit line BL and the reference current from the reference bit line $BL_R$, e.g. because of bit line mismatches or supply interferences, will be absorbed. Hence, the reading circuit is less susceptible against bit line mismatch and supply noise.

When the memory cell and the reference cell are activated or enabled by a word line activating signal, cell currents will flow over the bit line BL and the reference bit line $BL_R$. The respective cell currents entering the first and second cascode circuits 24, 25 will vary so that either of the output nodes X, Y will go to a high level while the other one remains on a low level. Therefore, three states are available at the output nodes X, Y, namely a) both being low, b) the first node X being high and the second node Y being low and c) the first node X being low and the second node Y being high. Accordingly, a current-mode tri-state buffer is realised.

The SRAM cell 28 comprises two cross coupled inverter I1, I2 and two output inverter I3, I4 in series coupled to the output of the inverter I1. The drains of two NMOS transistors N82, N92 as well as the drains of two further NMOS transistors N81, N91 are coupled to one another, respectively. An inverter I5 is connected with its input to the commonly coupled drains of the NMOS transistors N81, N91 and with its output to the commonly connected drains of the NMOS transistors N82, N92. The sources of the NMOS transistors N81 and N92 as well as sources of the NMOS transistors N82 and N91 the are coupled to one another and to the input and the output of the inverter I1, respectively.

The inverter $I_5$ together with $N_{82}$, $N_{92}$ enable the output signal to be inverted, i.e. bit invert, controlled by the signal BI.

The tri-state buffer 15 implements a set-reset latch function. This function can be realised using a multivibrator, a latch or a SRAM cell.

The use of a latching tristate buffer not only improves the speed of the reading circuit but more important it retains the data after the sense amplifier is disabled.

In a specific embodiment PMOS transistors P1, P2 comprise a width 3 μm, PMOS transistors P3, P4 a width of 10 μm, PMOS transistors P51, P61 a width of 4 μm, PMOS transistors P52, P62 a width of 8 μm, PMOS transistor P7 a width of 3 μm and the NMOS transistor N1 a width of 0.5 μm, wherein all lengths are 0.25 μm. NMOS transistor N3 has a width of 0.5 μm and a length of 1 μm and NMOS transistor N2 has a width of 0.5 μm and a length of 0.751 μm. The capacitance $C_{BL}$ and the capacitance $C_{BLr}$ have a value of 0.97–1.08 pico farads and 1 pico farads, respectively.

Furthermore NMOS transistors N41, N42, N6, N7 have a width of 0.5 μm, NMOS transistors N42, N52 have a width of 1.21 μm, NMOS transistors N81, N91 have a width of 3 μm, and NMOS transistors have a width of 6 μm, respectively, wherein alls lengths are 0.25 μm. Inverter I1, I2, I3 and I4 have width/length ratios of 2/1, 1/0.5, 5/2.1, and 18/7.8, respectively.

With the above width/length ratios the following access-times for various supply voltages are determined:

TABLE 1

| $V_{DD}$ (V) | access time (ns) |
|---|---|
| 2.8 | 0.75 |
| 2.5 | 0.8 |
| 1.5 | 1.8 |
| 1.2 | 3.0 |
| 0.9 | 8.0 |
| 0.6 | functional (80 ns) |

As apparent from table 1, the circuits remain functional to a supply voltage even lower than the MOS threshold voltage.

The reading circuit of this specific embodiment is dimensioned such that it draws a current about halfway between the memory cell current in the "1" and "0" states.

Application areas for the above reading circuit are standalone and embodied ROM, SRAMs with single bit lines as well as DRAMs.

The problem of low voltage operation is solved by never using stacked transistors.

The invention claimed is:

1. A reading circuit for reading a memory cell having a single bit line and a corresponding reference cell, comprising:
    a first and second cascode circuit (24; 25) each having an input terminal (24a; 25a) and two output terminals (24b, 24c; 25b, 25c) respectively said input terminals (24, 25) being adapted to be connected to a bit line of said memory cell and a corresponding reference bit line of said reference cell, respectively,
    a first and second current mirror circuit (26, 27) having a first and second terminal (26a, 26b; 27a, 27b), respectively,
    wherein said first terminal (26a) of said first current mirror circuit (26) is coupled to said first output terminal (24b) of said first cascode circuit (24) and said second terminal (26b) of said first current mirror circuit (26) is coupled to said second output terminal (25c) of said second cascode circuit (25),
    wherein said first terminal (27a) of said second current mirror circuit (27) is coupled to said first output terminal (25b) of said second cascode circuit (25) and said second terminal (27b) of said second current mirror circuit (27) is coupled to said second output terminal (24c) of said first cascode circuit (24); and
    a tri-state buffer (28) coupled between the second terminals (26b, 27b) of said first and second current mirror circuits (26, 27), wherein said tri-state buffer (28) having bit invert capabilities.

2. Reading circuit according to claim 1, wherein
    said first and second cascode circuits (24, 25) are adapted as folded cascodes each having two transistors coupled at their respective sources, wherein said input terminals (24a, 25a) of said first and second cascode circuits (24, 25) are coupled to said sources of said transistors of said cascode circuits (24, 25), respectively.

3. Reading circuit according to claim 1, wherein
    a ratio of the outputs from said first and second output terminals (24b, 24c; 25b, 25c) of said cascode circuits (24, 25) is adapted as 1:m, m being larger than or equal to 1, and
    said first and second current mirror circuits (26, 27) are configured having a n:1 current transfer ratio, n being larger than or equal to 1.

4. Reading circuit according to claim 3, wherein
    the current transfer factor n of said current mirror circuits (26, 27) is larger than the output ratio factor m of said cascode circuits (24, 25).

5. Reading circuit according to claim 1, wherein
    said tri-state buffer (28) is configured as a SRAM cell.

6. An integrated circuit including a memory having memory cells and reference cells, comprising:
    memory bit lines (BL),
    at least one reference bit line ($BL_R$),
    at least one reading circuit according to any one of claim 1,
    wherein an input terminal (24a) of a first cascode circuit (24) is coupled to said memory bit line (BL) and a input terminal (25a) of a second cascode circuit (25) is coupled to said reference bit line ($BL_R$).

* * * * *